United States Patent
Shim

(10) Patent No.: US 7,662,714 B2
(45) Date of Patent: Feb. 16, 2010

(54) METHOD FOR FORMING METAL LINE OF SEMICONDUCTOR DEVICE

(75) Inventor: Cheon Man Shim, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 11/321,592

(22) Filed: Dec. 30, 2005

(65) Prior Publication Data

US 2007/0093048 A1 Apr. 26, 2007

(30) Foreign Application Priority Data

Oct. 5, 2005 (KR) .................. 10-2005-0093464

(51) Int. Cl.
*H01L 21/4763* (2006.01)
(52) U.S. Cl. .................. 438/633; 257/E21.585
(58) Field of Classification Search .............. 438/674, 438/669, 671, 633, 634, 622, 618
See application file for complete search history.

(56) References Cited

U.S. PATENT DOCUMENTS

| | | | |
|---|---|---|---|
| 6,013,581 A * | 1/2000 | Wu et al. ............... | 438/734 |
| 6,184,138 B1 * | 2/2001 | Ho et al. ............... | 438/687 |
| 6,297,149 B1 * | 10/2001 | Stamper ................ | 438/637 |
| 6,576,300 B1 * | 6/2003 | Berry et al. ............ | 427/489 |
| 2002/0033486 A1 * | 3/2002 | Kim et al. .............. | 257/118 |
| 2002/0142582 A1 * | 10/2002 | Kim ...................... | 438/627 |
| 2005/0064698 A1 * | 3/2005 | Chang et al. .......... | 438/623 |
| 2005/0250320 A1 * | 11/2005 | Tsai et al. .............. | 438/672 |
| 2006/0105568 A1 * | 5/2006 | Shen et al. ............ | 438/671 |
| 2006/0172552 A1 * | 8/2006 | Ajmera et al. ........ | 438/778 |

FOREIGN PATENT DOCUMENTS

KR 10-2004-0001585 A 1/2004

OTHER PUBLICATIONS

Office Action from the Korean Intellectual Property Office, dated Oct. 20, 2006, in counterpart Korean Patent Application No. 10-2005-0093464.

* cited by examiner

*Primary Examiner*—Walter L Lindsay, Jr.
*Assistant Examiner*—Reema Patel
(74) *Attorney, Agent, or Firm*—Finnegan, Henderson, Farabow, Garrett, & Dunner, L.L.P.

(57) ABSTRACT

A method for forming a metal line of a semiconductor device uses a low dielectric constant material as an interlayer dielectric layer and treats a surface of the interlayer dielectric layer with plasma to prevent moisture and ammonia from being adsorbed in the low dielectric constant material. The method for forming a metal line of a semiconductor device includes forming a lower metal line layer on a semiconductor substrate, sequentially forming an etch stop layer and an interlayer dielectric layer on an entire surface including the lower metal line layer, forming a plasma layer by treating a surface of the interlayer dielectric layer with plasma, forming a photoresist pattern on the plasma layer, forming a via hole using the photoresist pattern as a mask to open the lower metal line layer, and forming a via contact by burying a metal material in the via hole.

13 Claims, 6 Drawing Sheets

METHOD FOR FORMING METAL LINE OF SEMICONDUCTOR DEVICE

This application claims the benefit of the Korean Patent Application No. P2005-0093464, filed on Oct. 5, 2005, which is hereby incorporated by reference in its entirety.

BACKGROUND

1. Technical Field

The present invention relates to a method for forming a semiconductor device, and more particularly, to a method for forming a metal line of a semiconductor device in which a low dielectric constant material is used as an interlayer dielectric layer and a surface of the interlayer dielectric layer is treated with plasma to prevent moisture and ammonia from being adsorbed in the low dielectric constant material.

2. Discussion of the Related Art

Recently, the number of devices integrated into one fingernail-sized semiconductor chip has approached, and in some cases exceeded, $1 \times 10^9$. This number of devices integrated into one semiconductor chip increases by geometrical progression. To obtain both high-integration and a high-speed in such a device, it is necessary to improve the development the semiconductor chip in both structural and material aspects. The improvement in the structure of the semiconductor chip involves an increase in the number of metal layers. Also, a shallow trench isolation (STI) method is used for isolation between the devices. In such devices, the semiconductor chip is formed of materials including copper (Cu) and low-dielectric materials (Low-k).

Particularly, with the increase of high integration of a semiconductor device, the distance between metal lines has become gradually narrowed and metal lines having a multi-level structure have been required. Parasitic capacitance and parasitic resistance components existing either between adjacent metal line layers on one layer or between adjacent lower or upper metal line layers have arisen as important problems. The need for a multilevel metal line having minimal parasitic capacitance and parasitic resistance components has been required in the manufacture of a high integrated semiconductor device having improved operational speed.

To form metal lines having reduced parasitic capacitance and parasitic resistance components, either metal having a low specific resistance such as Cu or a material having a low dielectric ratio such as low-k dielectric material is required as a metal line material.

Particularly, Cu has advantages in view of low specific resistance, low cost and simplified process. Also, Cu has demonstrated electro-migration effects better than that of aluminum by at least ten times.

Instead of existing $SiO_2$, a low dielectric constant material may be used to reduce power consumption and improve the speed of a semiconductor device. A material having a dielectric constant value 'k' less than 3 is used in a semiconductor device having a line width of 90 nm or below.

Hereinafter, a related art method for forming a metal line of a semiconductor device will be described with reference to the accompanying drawings.

FIG. 1A to FIG. 1E are sectional views illustrating related art process steps of forming a metal line of a semiconductor device.

First, as shown in FIG. 1A, an etch stop layer 12 is deposited on a semiconductor substrate in which a lower metal line layer 11 is formed. An interlayer dielectric layer 13 is thickly formed on the etch stop layer 12.

The etch stop layer 12 is formed of SiN, SiC, SiCN, or SiCO, and the interlayer dielectric layer 13 is formed of phosphorous silicate glass (PSG), boron phosphorous silicate glass (BPSG), undoped silicate glass (USG), fluorine doped silicate glass (FSG), SiOC, high density plasma (HDP), plasma enhanced-tetra ethyl ortho silicate (PE-TEOS), or spin on glass (SOG).

However, in a semiconductor device of 0.13 µm or less, Cu is used as a metal line layer and a low dielectric constant material such as low-k dielectric material is typically used as the interlayer dielectric layer 13 to minimize parasitic capacitance and parasitic resistance components.

At this time, if the low dielectric constant material is used as the interlayer dielectric layer, $SiO_2$ is deposited on the interlayer dielectric layer 13 to additionally form a capping layer 15. that the capping layer becomes necessary because the low dielectric constant material has a low density and thus will adsorb a gas including moisture and ammonia in the air. The capping layer 15 serves to prevent the low dielectric constant material from adsorbing the gas.

Next, as shown in FIG. 1B, a photoresist is deposited on the interlayer dielectric layer 13 and then patterned by exposing and developing processes to form a photoresist pattern 14 so that a region for a via hole is opened.

Afterwards, as shown in FIG. 1C, the capping layer 15 and the interlayer dielectric layer 13 are sequentially dry etched using the photoresist pattern 14 as an etching mask to form the via hole 16. As a result, the etch stop layer 12 is exposed through the via hole 16.

Subsequently, as shown in FIG. 1D, the photoresist pattern 14 is removed by an ashing process and the etch stop layer 12 exposed through the via hole 15 is etched to open the lower metal line layer 11.

Then, the opened via hole 16 is filled with a metal material 17 such as Cu so that the metal material 17 contacts the lower metal line layer 11 through the via hole 16.

Finally, as shown in FIG. 1E, the overfilled metal material 17 is planarized by a chemical mechanical polishing (CMP) process. In this case, the metal material 17 is removed by the CMP process until the capping layer 15 is exposed. Thus, a via contact 20 that contacts the lower metal line layer 11 is formed. The lower metal line layer 11 will be electrically connected to an upper metal line layer to be formed later, through the via contact 20.

However, the related art method for forming a metal line of a semiconductor device has several problems.

Since the low dielectric constant material used as the interlayer dielectric layer can adsorb a gas including moisture and ammonia in the air, any ammonia adsorbed in the low dielectric constant material during the process is externally emitted which will disturb the patterning process for forming the metal line. This will prevent the proper formation of a metal line, which can adversely affect the yield. Also, if the low dielectric constant material adsorbs any moisture, a dielectric constant value of the low dielectric constant material will increase, further deteriorating characteristics of the device.

The capping layer is additionally deposited on the interlayer dielectric layer of the low dielectric constant value to prevent moisture and ammonia from being adsorbed in the interlayer dielectric constant material. However, since the capping layer is formed of $SiO_2$ having a high dielectric constant value, parasitic capacitance is increased between a lower metal and an upper metal, thereby also deteriorating the performance of the device.

A photoresist less responsive to ammonia may be used as the interlayer dielectric layer. However, such a photoresist is expensive and thus increases the process cost.

SUMMARY

Consistent with the present invention, there is provided a method for forming a metal line of a semiconductor device, which substantially obviates one or more problems due to limitations and disadvantages of the related art.

Consistent with the present invention there is further provided a method for forming a metal line of a semiconductor device in which a low dielectric constant material is used as an interlayer dielectric layer and a surface of the interlayer dielectric layer is treated with plasma to prevent moisture and ammonia from being adsorbed in the low dielectric constant material.

Consistent with a purpose of the invention, as embodied and broadly described herein, there is further provided a method for forming a metal line of a semiconductor device includes forming a lower metal line layer on a semiconductor substrate, sequentially forming an etch stop layer and an interlayer dielectric layer on an entire surface including the lower metal line layer, forming a plasma layer by treating a surface of the interlayer dielectric layer with plasma, forming a photoresist pattern on the plasma layer, forming a via hole using the photoresist pattern as a mask to open the lower metal line layer, and forming a via contact by burying a metal material in the via hole.

The method for forming a metal line of a semiconductor device may be characterized in that instead of depositing a capping layer that deteriorates performance of the device, a low dielectric constant material is used as the interlayer dielectric layer and the surface of the interlayer dielectric layer is treated with plasma to prevent moisture and ammonia from being adsorbed in the low dielectric constant material. The surface of the interlayer dielectric layer is treated with plasma in such a manner that a thin $SiO_2$ layer is formed using $O_2$ gas or a SiN, SiCN, SiCO or SiON layer may be formed using $NH_3$ gas. Since the surface of the interlayer dielectric layer is treated with plasma without forming the capping layer, it is possible to improve productivity. In addition, since no expensive photoresist is required, it is possible to select the photoresist within a wider range.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments consistent with the invention and together with the description serve to explain the principle of the invention. In the drawings.

DETAILED DESCRIPTION

Reference will now be made in detail to the preferred embodiments consistent with the present invention, examples of which are illustrated in the accompanying drawings. Wherever possible, the same reference numbers will be used throughout the drawings to refer to the same or like parts.

FIG. 2A to FIG. 2E are sectional views illustrating process steps of forming a metal line of a semiconductor device consistent with the present invention.

Figure 1A:
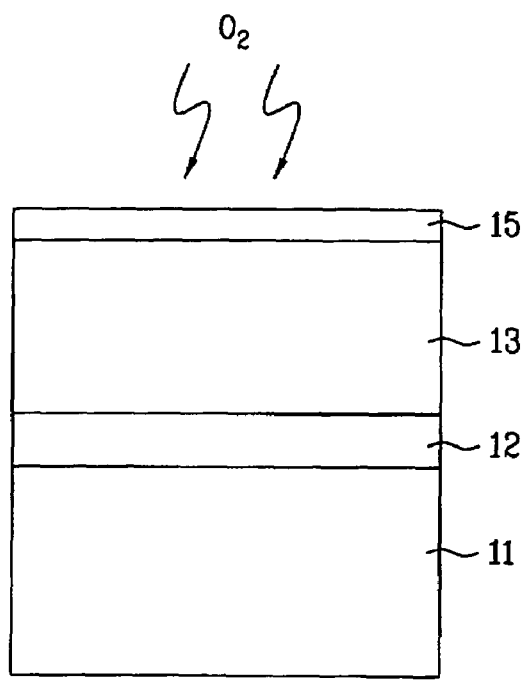
FIG. 1A to FIG. 1E are sectional views illustrating related art process steps of forming a metal line of a semiconductor device.
Figure 1B:
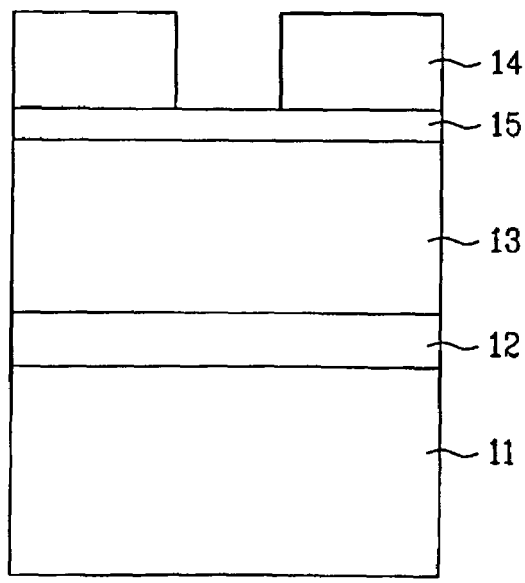
Figure 1C:
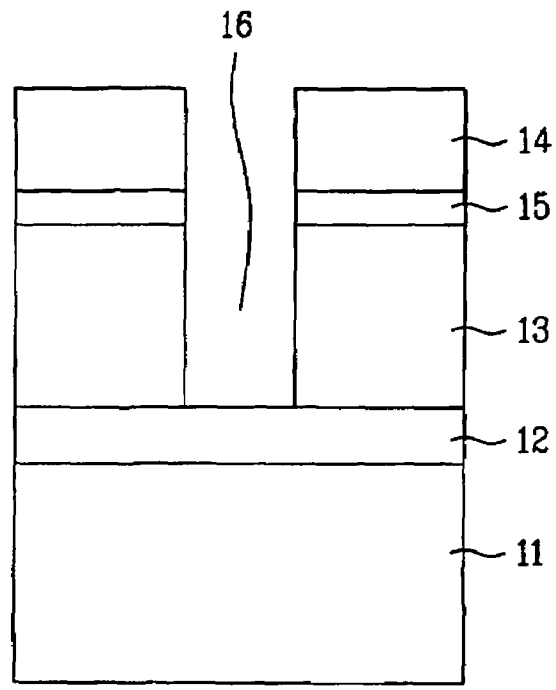
Figure 1D:
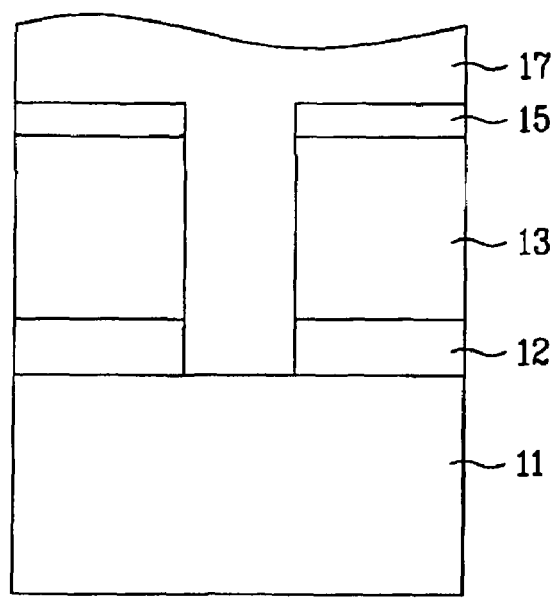
Figure 1E:
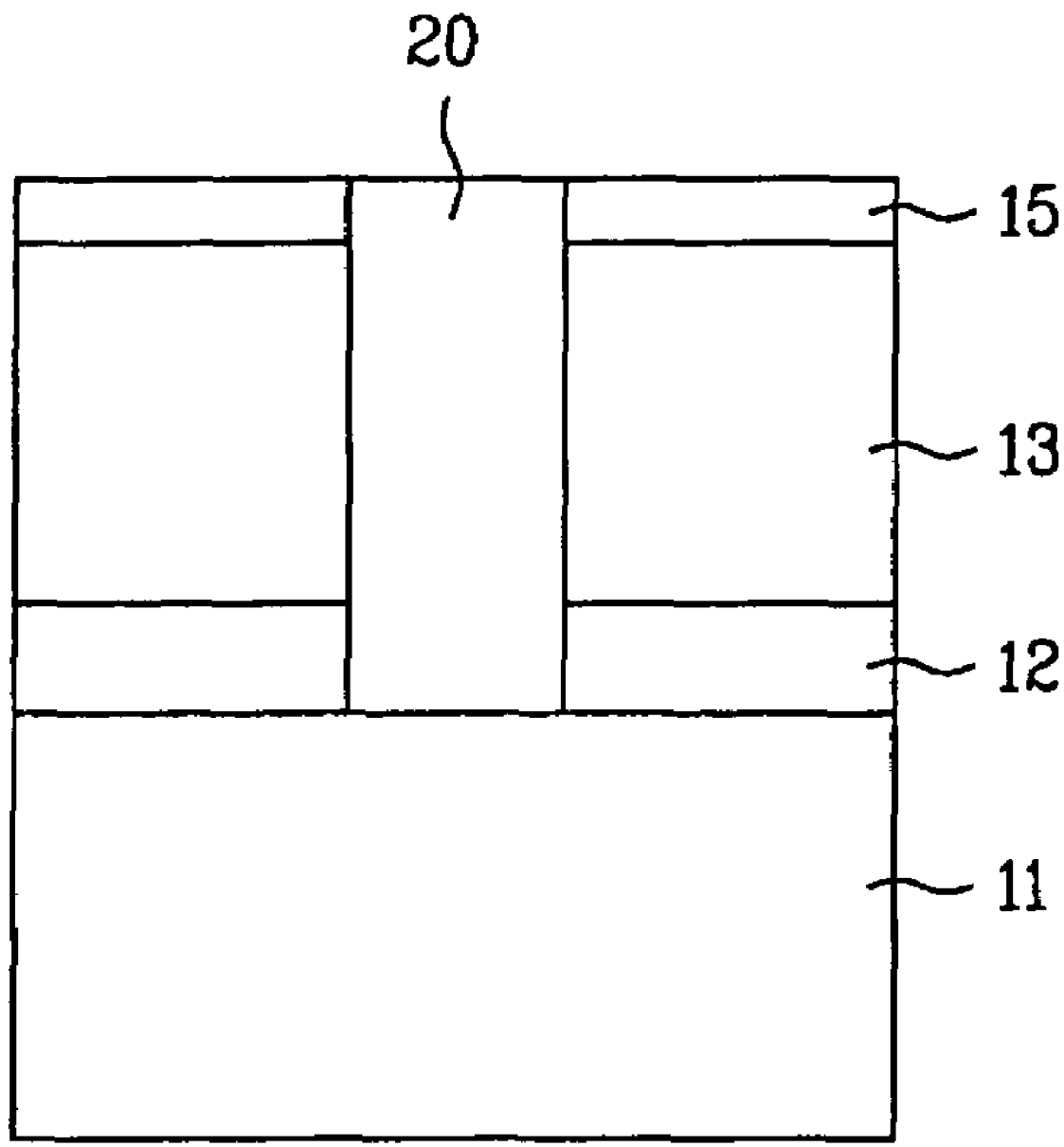
Figure 2A:
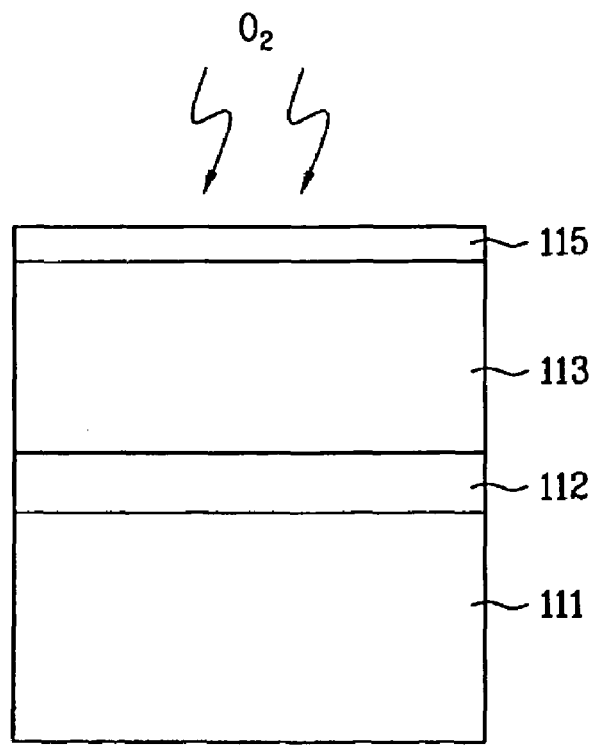
FIG. 2A to FIG. 2E are sectional views illustrating process steps of forming a metal line of a semiconductor device consistent with the present invention.

As shown in FIG. 2A, an etch stop layer 112 is deposited on a semiconductor substrate in which a lower metal line layer 111 is formed.

The semiconductor substrate may be a silicon wafer substrate. The semiconductor substrate may be another material layer including a special conductive layer including an impurity doping region formed in the semiconductor substrate, a metal line layer of Cu, or other conductive pattern.

The etch stop layer 112 is preferably formed of a material having a high etch selectivity ratio to an interlayer dielectric layer 113 formed on the etch stop layer. For example, the etch stop layer 112 may be formed of SiN, SiC, SiCN, or SiCO. The etch stop layer 112 may be formed at a thickness of about 200 Å to 1000 Å, preferably about 500 Å. The etch stop layer 112 serves to prevent a metal material of the lower metal line layer 111 from diffusing into the interlayer dielectric layer, formed in a later step.

Next, an interlayer dielectric layer 113 is thickly formed on the etch stop layer 112. The interlayer dielectric layer 113 may be formed in such a manner that a low-k material having a dielectric constant value of 3 or less is deposited. The interlayer dielectric layer 113 may be formed at a thickness of about 1500 Å to 15000 Å, preferably about 3000 Å to 5000 Å.

A surface of the interlayer dielectric layer 113 is. treated with plasma using $O_2$ gas to form a thin plasma layer 115 on the interlayer dielectric layer 113. The thin plasma layer 115 serves to prevent moisture or ammonia in the air from being diffused or adsorbed into the interlayer dielectric layer. 113.

If the interlayer dielectric layer 113 is treated with $O_2$ plasma as above, the plasma layer 115 becomes a $SiO_2$ layer. At this time, in addition to $O_2$, He, $H_2$, Ar, CO or $N_2$ may be used.

Meanwhile, the surface of the interlayer dielectric layer 113 may be treated with plasma using a gas. including $NH_3$. In this case, the plasma layer 115 becomes a SiN, SiCN, SiCO, or SiON layer. At this time, in addition to $NH_3$, He, $H_2$, Ar, CO or $N_2$ may be used.

The surface of the interlayer dielectric layer 113 is treated with plasma at a temperature of about 30° C. to 400° C., power of about 1 W to 10 KW, and pressure of about 0.1 torr to 10 torr.

Figure 2B:
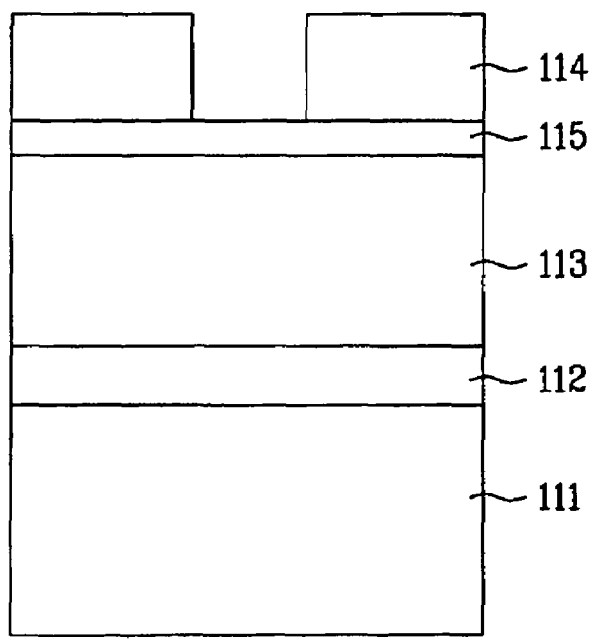

Next, as shown in FIG. 2B, a photoresist is deposited on the plasma layer 115 and then patterned by exposing and developing processes to form a photoresist pattern 114 so that a region for a via hole is opened. At this time, impurities of the photoresist may diffuse into the interlayer dielectric layer having a low density if a plasma layer is not inserted between the interlayer dielectric layer and the photoresist pattern. However, by forming the plasma layer 115, it is possible to prevent the impurities from diffusing into the interlayer dielectric layer 113. Therefore, since an expensive photoresist having no impurities is not required, it is possible to select the photoresist within a wider range.

Figure 2C:
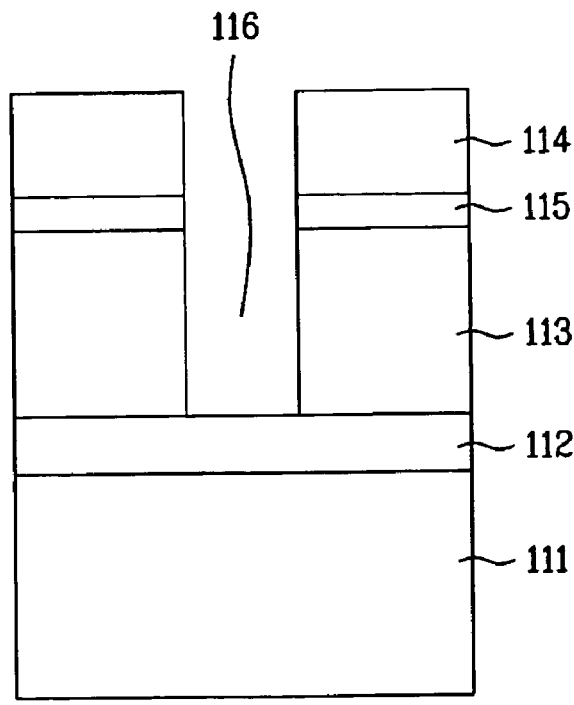

Afterwards, as shown in FIG. 2C, the plasma layer 115 and the interlayer dielectric layer 113 are removed using the photoresist pattern 114 as an etching mask to form the via hole 116. As a result, the etch stop layer 112 is exposed through the via hole 116. The plasma layer is simultaneously removed along with the interlayer dielectric layer due to its thinness.

Figure 2D:
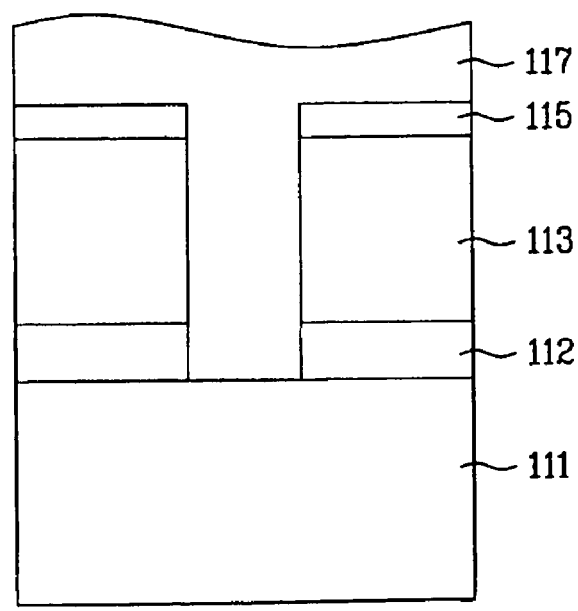

Subsequently, as shown in FIG. 2D, the photoresist pattern 114 is removed by an ashing process. A dry etching process may be used as the ashing process. The dry etching process may be classified into one based on $O_2$ plasma discharge and another one based on $O_3$. The $O_2$ plasma ashing process removes the photoresist by reacting a byproduct of $O_2$ plasma, i.e., $O_2$ radical with an organic matter, i.e., the photoresist, to generate $CO_2$ and then pumping $CO_2$ out using a vacuum pump. By contrast, the $O_3$ ashing process removes the photoresist under a normal pressure by using a strong, oxidation reaction of $O_3$. Consistent with the present invention, the ashing process is not limited to the $O_2$ plasma ashing process or the $O_3$ ashing process. Another ashing process may be used consistent with the present invention.

Then, the etch stop layer 112 exposed through the via hole 116 is etched to externally expose the lower metal line layer 111.

Subsequently, the via hole 116 is filled with a metal material 117 so that the metal material 117 contacts the lower metal line layer 111 through the via hole 116. Either a metal having low specific resistance, such as Cu, Al, Ag and Au, or their alloys, may be used as the metal material 117. Cu is preferably used in a semiconductor device of high integration.

At this time, an antidiffusion layer may further be provided to prevent the metal material from being diffused. Either a single layer, such as Ta, TaN, W, WN, Ti, and TiN, or their composite layer may be used as the antidiffusion layer. The antidiffusion layer is preferably formed at a thickness of about 100 Å to 1000 Å.

Afterwards, a planarization process is performed using a CMP process. That is, the metal material 117 and the plasma layer 115 are removed by the CMP process until the interlayer dielectric layer 113 is exposed. If the plasma layer 115 is not removed, parasitic capacitance may be generated between the lower metal line layer and an upper metal line layer. Therefore, the plasma layer 115 is also removed when the metal material 117 is removed.

Figure 2E:
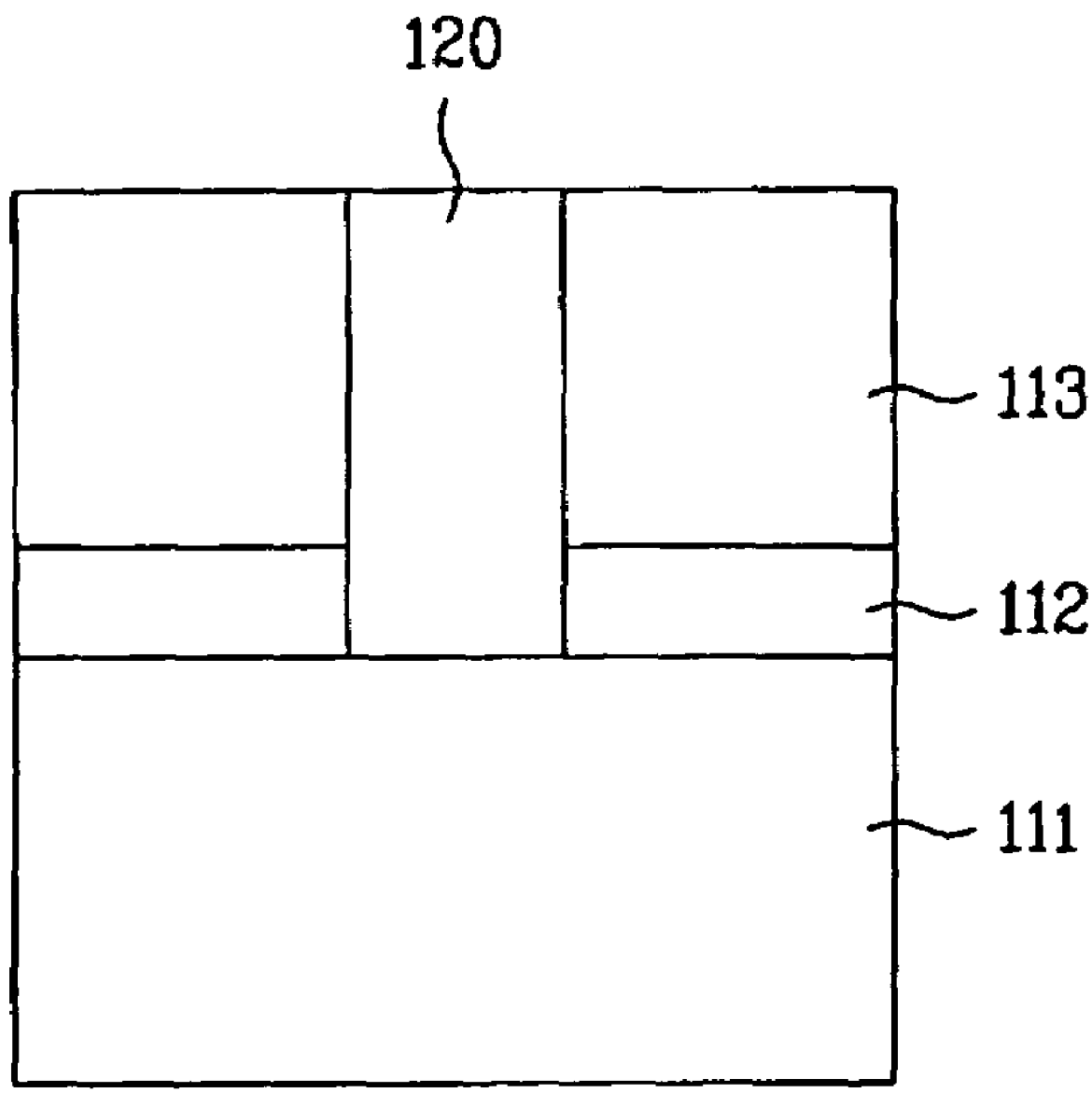

Thus, as shown in FIG. 2E, a via contact 120 of a single damascene structure is completed. Although not shown, the upper metal line layer (not shown) is formed on the via contact 120 and electrically connected with the lower metal line layer 111.

Afterwards, an antidiffusion layer (not shown) may further be formed on the entire surface including the via contact if necessary. The antidiffusion layer is formed of SiN, SiC, or so on at a thickness of about 500 Å to 1000 Å.

As described above, the method for forming a metal line of a semiconductor device according to the present invention has the following advantages.

In the semiconductor device of high integration, which uses the low dielectric constant material as the interlayer dielectric layer, instead of depositing a capping layer, the surface of the interlayer dielectric layer is treated with plasma to prevent moisture and ammonia from being adsorbed in the low dielectric constant material. Thus, the plasma layer is formed on the interlayer dielectric layer so that the interlayer dielectric layer can be protected from moisture and ammonia in the air. Since the surface of the interlayer dielectric layer is treated with plasma without forming the capping layer, it is possible to improve productivity. In addition, since no expensive photoresist is required, it is possible to select the photoresist within a wider range.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method for forming a semiconductor device, the method comprising:
    forming a lower metal line layer on top of and in direct contact with a semiconductor substrate;
    forming an etch stop layer of at least one of SiN, SiC, SiCN, and SiCO, on top of and in direct contact with the lower metal line layer;
    forming an interlayer dielectric layer on top of and in direct contact with the etch stop layer;
    forming a plasma layer on top of and in direct contact with the interlayer dielectric layer by treating the surface of the interlayer dielectric layer with plasma at a temperature of 30° C. to 400° C., wherein forming the plasma layer comprises treating the surface of the interlayer dielectric layer with plasma using $O_2$ gas;
    forming a photoresist pattern on top of and in direct contact with the plasma layer;
    removing the plasma layer and the interlayer dielectric layer using the photoresist pattern as a mask to form a via hole exposing the etch stop layer;
    removing the etch stop layer externally exposing the lower metal line layer;
    forming a metal material on the plasma layer and in the via hole;
    forming a first antidiffusion layer on the metal material;
    removing the first antidiffusion layer, the metal material, and the plasma layer by a CMP process until the interlayer dielectric layer is exposed to form a via contact in the via hole; and
    forming a second antidiffusion layer over the interlayer dielectric layer and via contact following the CMP process.

2. The method as claimed in claim 1, wherein forming the plasma layer further comprises treating the surface of the interlayer dielectric layer with plasma using He, $H_2$, Ar, Co, or $N_2$ in addition to $O_2$.

3. The method as claimed in claim 1, wherein forming a plasma layer comprises forming a $SiO_2$ layer.

4. The method as claimed in claim 1, wherein forming the plasma layer comprises treating the surface of the interlayer dielectric layer with plasma at a power of about 1 W to 10 KW.

5. The method as claimed in claim 1, wherein forming the plasma layer comprises treating the surface of the interlayer dielectric layer with plasma at a pressure of about 0.1 torr to 10 torr.

6. The method as claimed in claim 1, wherein forming the lower metal line layer comprises forming a lower line layer of Cu.

7. The method as claimed in claim 1, wherein forming the interlayer dielectric layer comprises forming a layer of low-k dielectric material.

8. The method as claimed in claim 1, wherein forming the interlayer dielectric layer comprises forming a layer of low-k dielectric material having a dielectric constant value of 3 or less.

9. The method as claimed in claim 1, further comprising planarizing the metal material using a CMP process after burying the metal material in the via hole.

10. The method as claimed in claim 1, wherein forming the first antidiffusion layer comprises forming a layer comprising at least one of Ta, TaN, W, WN, Ti, TiN, or a composite thereof.

11. A method for forming a semiconductor device, the method comprising:
    forming a lower metal line layer on top of and in direct contact with a semiconductor substrate;

forming an etch stop layer of at least one of SiN, SiC, SiON, and SiCO, on top of and in direct contact with the lower metal line layer;

forming an interlayer dielectric layer on top of and in direct contact with the etch stop layer;

forming a plasma layer on top of and in direct contact with the interlayer dielectric layer by treating the surface of the interlayer dielectric layer with plasma at a temperature of 30° C. to 400° C., wherein forming the plasma layer comprises treating the surface of the interlayer dielectric layer with plasma using $NH_3$ gas;

forming a photoresist pattern on top of and in direct contact with the plasma layer;

removing the plasma layer and the interlayer dielectric layer using the photoresist pattern as a mask to form a via hole exposing the etch stop layer;

removing the etch stop layer externally exposing the lower metal line layer;

forming a metal material on the plasma layer and in the via hole;

forming a first antidiffusion layer on the metal material;

removing the first antidiffusion layer, the metal material, and the plasma layer by a CMP process until the interlayer dielectric layer is exposed to form a via contact in the via hole; and forming a second antidiffusion layer over the interlayer dielectric layer and via contact following the CMP process.

12. The method as claimed in claim 11, wherein forming the plasma layer further comprises treating the surface of the interlayer dielectric layer with plasma using He, $H_2$, Ar, Co, or $N_2$ in addition to $NH_3$.

13. The method as claimed in claim 11, wherein forming the plasma layer comprises forming a layer of at least one of SiN, SiON, SiCO or SiON.

* * * * *